United States Patent [19]

Bajor et al.

[11] Patent Number: 4,771,016
[45] Date of Patent: Sep. 13, 1988

[54] USING A RAPID THERMAL PROCESS FOR MANUFACTURING A WAFER BONDED SOI SEMICONDUCTOR

[75] Inventors: George Bajor; Joseph S. Raby, both of Melbourne, Fla.

[73] Assignee: Harris Corporation, Melbourne, Fla.

[21] Appl. No.: 42,135

[22] Filed: Apr. 24, 1987

[51] Int. Cl.[4] .................. H01L 21/20; H01L 21/76
[52] U.S. Cl. ................................ 437/180; 437/21; 437/111; 437/939; 437/942
[58] Field of Search .............. 437/21, 111, 939, 942, 437/180

[56] References Cited

U.S. PATENT DOCUMENTS

| | | | |
|---|---|---|---|
| 4,479,297 | 10/1984 | Mizutani et al. | 437/21 |
| 4,540,452 | 9/1985 | Croset et al. | 148/DIG. 77 |
| 4,601,779 | 7/1986 | Abernathy et al. | 156/628 |
| 4,649,627 | 3/1987 | Abernathey et al. | 437/84 |

OTHER PUBLICATIONS

Dutartre et al., Jour. Appl. Phys., 59 (1986) 632
Ohasi, et al., Improved Dielectrically Isolated Device Integration by Silicon-wafer Direct Bonding (SDB) Technique, IDEM 1986, vol. 9.1, pp. 210-213.
Lasky, et al., Silicon-On, Insulator (SOI) by Bonding and Etch-Back, IDEM 1985, vol. 28.4, pp. 684-687.
IBM Corp., Methods of Producing Single-Crystal Silicon on Silicon Dioxide, IBM Technical Disclosure Bulletin, 1985, vol. 28, No. 5, pp. 1855-1856.
SOI by Wafer Bonding with Spin-On Glass as Adhesive, Electronics Letters, 1987, vol. 23, No. 1, pp. 39-40.
Dharmadhikari, et al., Optimization of a Rapid Thermal Reflow Process of PSG Using Statistical Methods, Harris Semiconductor.

Primary Examiner—Upendra Roy
Attorney, Agent, or Firm—William A. Troner; Charles C. Krawczyk

[57] ABSTRACT

A method of forming a high quality silicon on insulator semiconductor device using wafer bonding. The annealing time for the wafer bonding process is substantially reduced through the use of a rapid thermal annealer, thereby resulting in minimizing the redistribution of the doping concentration resulting from the annealing process.

21 Claims, 2 Drawing Sheets

USING A RAPID THERMAL PROCESS FOR MANUFACTURING A WAFER BONDED SOI SEMICONDUCTOR

FIELD OF THE INVENTION

The present invention relates generally to a method of producing semiconductor wafers, and more specifically to a method of forming a silicon on insulator structure.

BACKGROUND OF THE INVENTION

There has been an intensive effort to produce quality silicon on insulator (SOI) semiconductors for purposes of increasing speed, decreasing power dissipation, and improving transient radiation hardness. An important feature in achieving quality SOI semiconductors is to minimize the annealing time temperature product involved in producing the SOI device. This time temperature product required for annealing is significant due to its direct relationship to the redistribution of the doping concentration. As the annealing time is extended for a given temperature, the greater the redistribution of dopants occurs resulting in reducing the quality in performance of the SOI device.

An example of a method of producing an SOI wafer is found in an article by Ohasi, et al., "Improved Dielectrically Isolated Device Integration by Silicon-Wafer Direct Bonding (SDB) Technique," IDEM, Vol. 1, No. 9.1, 1986, pp. 210-213. This article describes wafers being fused together by forming a layer of silicon dioxide on one of the wafers and then placing the wafers such that they are abutting each other. These wafers are then heated in a furnace at approximately 1100° C. for four (4) hours. As a result of the significantly long annealing time required for the bonding to result in the above method, there is a substantial redistribution of dopant materials in the silicon which could result in poor quality devices in the final SOI product.

Because a furnace is typically used in the annealing process for methods such as that described above, a reduction of annealing time is not possible without adversely affecting the quality of the bond between the wafers. This is a result of the practical timing limitations of using a standard furnace annealer which are well known in the art.

SUMMARY OF THE INVENTION

It is thus an object of the present invention to provide a new and improved silicon on insulator fabrication process.

It is another object of the present invention to provide a silicon on insulator fabrication process having a substantially reduced annealing time required for bonding thereby resulting in the reduction of the redistribution of dopants.

In accordance with a preferred embodiment of the invention, a rapid thermal process is used to form a silicon on insulator structure. This rapid thermal process includes rapidly heating the wafers in approximately 30 seconds or less to a relatively high temperature between approximately 800° C. and approximately 1200° C. This process can be implemented using a rapid thermal annealer (RTA) such as the Heat Pulse 210 manufactured by A. G. Associates. Although the Heat Pulse 210 can attain a maximum temperature of 1200° C. within 30 seconds, any comparable RTA will achieve the results of the invention.

In a preferred practice of the invention, a thin epitaxial layer is formed on a silicon substrate. This epitaxial layer is then bonded to a handle wafer having an insulating layer thereon by bringing the epitaxial layer into contact with the insulating layer and placing the same in the RTA. As a result of using the RTA, the annealing process can take place at a temperature between approximately 800° C. and approximately 1200° C. for approximately three to ten minutes. After the bonding of the wafers is completed, the silicon substrate may be removed. It is noted that an insulating layer may be applied to the epitaxial layer as an alternative or in addition to the insulating layer formed on the handle wafer.

The inventors have discovered that a quality bond between the respective substrate and handle wafers can be accomplished in an RTA at a substantial reduction in annealing time than what was provided in the prior art. As a result, a significant reduction in the redistribution of doping concentrations in the thin epitaxial layer during the annealing process occurs without reducing the effectiveness of the overall bond.

In another preferred embodiment, the annealing process may be further reduced by providing before bonding a layer of doped silica glass on both the exposed surfaces of the insulating layer and the handle wafer. The respective silica glass layers are then brought into contact together in the RTA, whereby the glass will participate in the bonding process. Because the glass will soften in the temperature range desired for bonding, e.g. 800° C. to 1200° C., the bonding between the glass layers will result even faster relative to the bonding in the previous embodiment between an oxide layer and the handle wafer. An additional advantage of using the silica glass layers is the ability of the glass to fill in any holes or grooves on the undulating surface of the insulating layer, which results in enhancing the bonding strength even more.

Further objects, features, and advantages of the present invention will become more apparent from the following description when taken with the accompanying drawings which show, for purposes of illustration only, an embodiment in accordance with the present invention.

BRIEF DESCRIPTIONS OF THE DRAWINGS

DETAILED DESCRIPTION OF THE DRAWINGS

Figure 1:
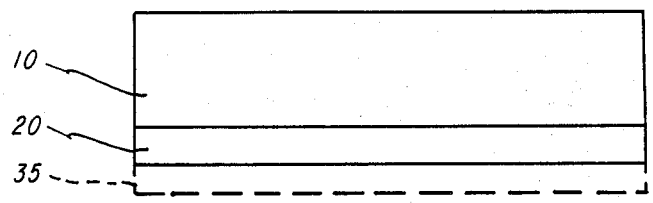
FIGS. 1-4 is an illustration showing the various process stages of the preferred embodiment of the invention.

FIGS. 1-4 illustrate a process which can be used in accordance with the present invention. In FIG. 1, a substrate 10 is provided, preferably of of silicon having (100) orientation and low electrical resistivity (0.01 ohm-cm), although any type of silicon material intended for use in silicon on insulator product can benefit from this invention. Typically, this substrate 10 will be approximately 500 $\mu$m thick. An epitaxial layer of high resistivity (1-10 ohm-cm) 20 is provided on the substrate in any number of known techniques e.g., by chemical vapor deposition.

Figure 2:
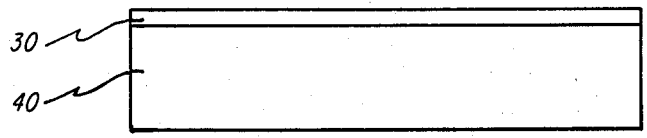

In FIG. 2 another wafer 40 is illustrated, commonly referred to as a handle wafer. The handle wafer can be chosen of any type of wafer such as silicon, which has a flat, polished surface. An oxide layer 30 may be provided on this polished surface by any suitable technique, i.e. thermal oxidation in a temperature range of 850°–1250° C. This oxide layer will serve as the dielectrically passivating layer in the SOI structure. In the preferred process, this dielectrically passivating layer will be between about 1–4 micrometers thick.

Figure 3:
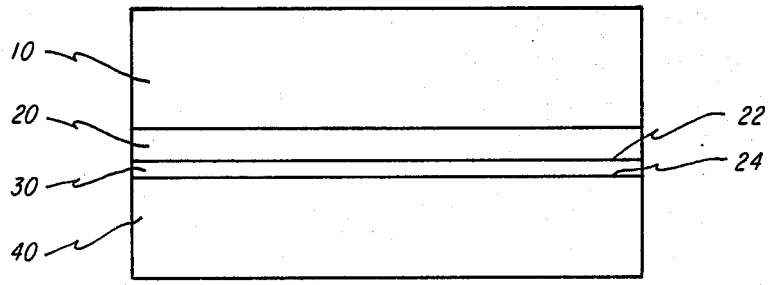
Figure 4:
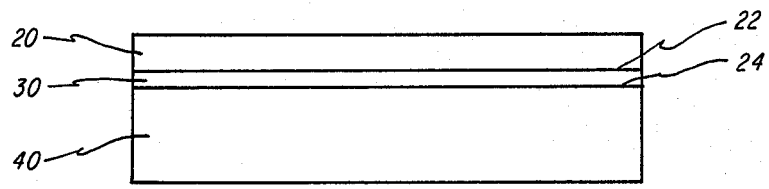
Figure 5:
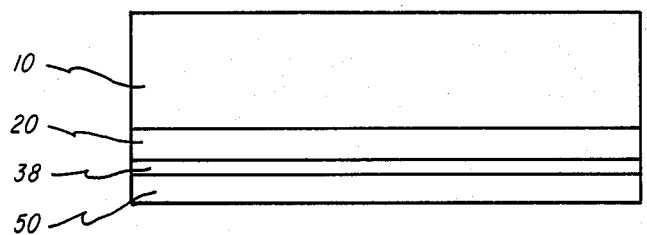
FIGS. 5-8 is an illustration showing the various process stages of another preferred embodiment of the invention.
Figure 6:
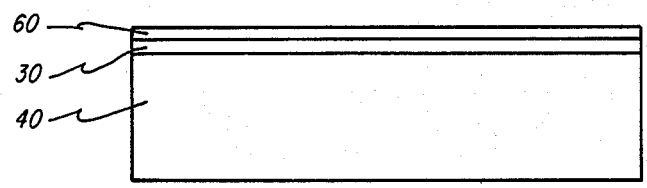
Figure 7:
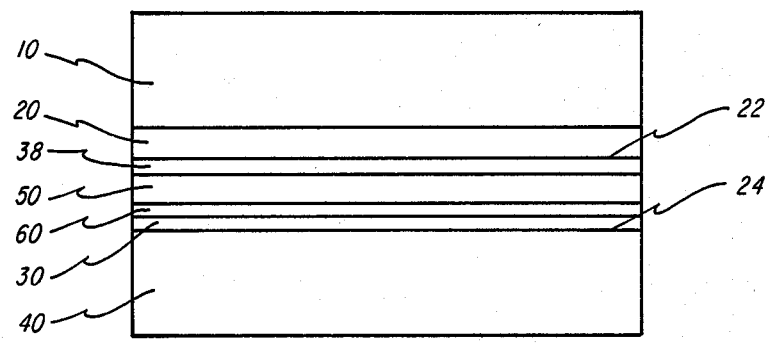
Figure 8:
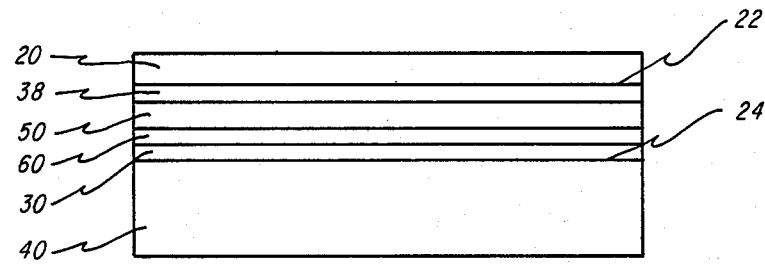

The bonding of the substrate wafer 10 and the handle wafer 40 is shown in FIG. 3. The epitaxial layer 20 on the substrate wafer 10 is placed into contact with the oxide layer 30 on the handle wafer 40. The two wafers are then placed in a rapid thermal annealer (RTA) which is capable of heating the wafers up to 1200° C. in thirty seconds or less. After the wafers are placed in the RTA, they are rapidly heated to a temperature between approximately 800° and approximately 1200° C. for approximately three to ten minutes. The RTA should be purged of contaminents by a gas during this process.

It is currently believed by the inventors that the bonding may be accomplished in either an oxygen containing environment or oxygen-free environment. While the presence of oxygen may facilitate oxide growth during the bonding process, it is believed that the residual oxygen which is present at the silicon to silicon dioxide interface and in the form of hydroxols, may contribute to or actually be the bonding mechanism. Therefore, the purging gas used to purge the RTA of contaminents can be an oxygen containing gas, although an oxygen containing gas is not needed.

During the high temperature treatment, it is also believed there is a thermal oxidation process resulting on the surfaces of the epitaxial layer 20 and the oxide layer 30 in between the handle wafer and the substrate wafer. Since these two layers are in contact with each other, the oxide layers created by the rapid heat treatment will grow together, thus creating the bonding between the two wafers.

In order to complete the SOI structure, the original wafer substrate 10 is ground and etched away in a fashion similar to that described in U.S. Pat. No. 4,554,059 to Short et al., entitled "Electrochemical Dielectric Isolation Technique," and incorporated herein by reference. The surface is then polished down to the interface between the substrate 10 and the epitaxial layer 20. This is illustrated on FIG. 4, where an SOI structure can be seen. The active silicon layer 20, where the integrated circuits will be fabricated, is on the top 22 of a dielectrically insulating layer 30 that in turn is on the top 24 of a handle wafer 40, with the handle wafer 40 merely providing the means for carrying the thin active layer 20.

In another bonding technique, in addition to the oxide layer provided on the handle wafer 40, a separate oxide or other insulating layer 35 such as silicon nitride, may be grown or deposited on the epitaxial layer 20 prior to bonding. This results in the insulating layers 30 and 35 bonding together to form a thicker insulating layer than would exist relative to having only a single oxide layer on the handle 40. Such a thicker insulating layer may be advantageous on high voltage applications. Similar to the first preferred embodiment, the bonding process would take place in an RTA or in an equivalent thereof, whereby the respective oxide layers are arranged in contact with each other in the RTA and heated to a temperature between approximately 800° and approximately 1200° C. for approximately three to ten minutes. Although an additional few minutes may be required for the bonding due to the extra thick oxide layer, the use of the RTA will nonetheless substantially reduce the annealing time relative to that provided in the prior art, and thus result in the relative reduction in the redistribution of the doping concentration.

In another technique as shown in FIGS. 5–8, a reflowable doped silica glass such as Boro-Silica, glass (BSG), Phospho-Silica glass (PSG) or Boro-Phosphorous silica glass (BPSG) layers 50 and 60 are provided on both the epitaxial layer 20, and on the insulating layer 30. In a preferred process, the doped silica glass is borophosphorus silicate comprising approximately 4% phosphorus and 4% boron. The silicate layers 50 and 60 are deposited by chemical vapor deposition at a temperature range of between about 300° C.–500° C. resulting in a thickness of about 500 to 10,000 angstroms for each layer. Because the doped silica glass provides an additional layer of insulation, the oxide layer 30 can be made relatively thinner than without the glass. This doped silica glass has a melting temperature as low as 850° C., and thus, the glass layers 50 and 60 will be in a liquid state at the temperature used in the RTA annealing process. The combination of the doped silica glass with that of a thinner oxide layer, permits for an overall reduction in the RTA annealing time required for the bonding to occur.

A silicon nitride 38 layer may be preferred over the epitaxial layer 20 between the epitaxial layer 20 and the doped silica glass 50 because of its advantages of preventing the contaminants in the doped silica glass from diffusing into the epitaxial layer 20. It is noted that if a nitride layer is used, a pad oxide (not shown) will necessarily be grown or deposited on the epitaxial surface 20 prior to the application of the nitride 38.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of manufacturing a semiconductor wafer comprising the steps of:
   (a) providing a first layer of semiconductor material formed on a first support structure, said first layer having an exposed top surface;
   (b) providing a second layer of an insulative material formed on a handle wafer; said second layer having an exposed top surface;
   (c) engaging said top surface of said first layer with said top surface of said second layer; and
   (d) bonding said first support structure to said handle wafer by annealing said first and second layers using a rapid thermal process.

2. The method of claim 1, wherein said rapid thermal process includes use of a rapid thermal annealer for said bonding.

3. The method of claim 2, wherein said bonding includes the steps of bringing said exposed surface of said first layer and the exposed surface of said second layer into contact, and heating said exposed surfaces at a temperature between approximately 800° C. and approximately 1200° C. for approximately three to ten minutes.

4. The method of claim 3, further comprising the step of removing said support structure from said semiconductor layer.

5. The method of claim 4, wherein said semiconductor material includes silicon, said support structure includes a silicon substrate and said insulative material includes silicon dioxide.

6. A method of manufacturing a semiconductor wafer comprising the steps of:
 (a) providing a first layer of semiconductor material formed on a first support structure, said first layer having an exposed surface;
 (b) providing a second layer of insulative material on a second support structure, said second layer having an exposed surface;
 (c) bringing said exposed surfaces of said first layer of semiconductor material and said second layer of insulative material into contact; and
 (d) bonding said surfaces of said first and second layers by heating said surfaces to approximately 800° C. to 1200° C. for approximately 3 to 10 minutes.

7. The method of claim 6, wherein said bonding includes use of a rapid thermal annealer.

8. The method of claim 7, further comprising the step of removing said support structure from said first layer of semiconductor material.

9. A method of forming a silicon on insulator wafer comprising the steps of:
 (a) forming on a silicon substrate a layer of silicon having an exposed surface;
 (b) providing a first oxide layer on said exposed surface, said oxide layer having an exposed top surface,
 (c) bonding said oxide layer to a handle wafer in a rapid thermal annealer; and
 (d) removing said silicon substrate from said layer of silicon.

10. The method of claim 9, wherein said bonding includes the steps of bringing said layer of oxide and handle wafer into contact and heating the same to a temperature of between approximately 800° C. and approximately 1200° C. in less than thirty seconds and then maintaining said temperature for approximately three to ten minutes.

11. The method of claim 10, wherein a second oxide layer is provided on a surface of said handle wafer and wherein said bonding of said oxide layer to said handle wafer comprises bonding said second oxide layer to said first oxide layer.

12. The method of claim 10, wherein said layer of silicon is formed by epitaxial growth on said substrate.

13. The method of claim 12, wherein said first oxide layer is formed by chemical vapor deposition.

14. The method of claim 12, wherein said first oxide layer is formed by oxidation.

15. A method of manufacturing a semiconductor wafer comprising:
 (a) providing a support structure;
 (b) forming a first layer of semiconductor material having an exposed surface upon said support structure;
 (c) providing a first layer of an insulative material on said exposed surface, said first layer of insulated material having an exposed top surface;
 (d) providing a first layer of doped silica glass on said exposed top surface of said first layer of said insulated material;
 (e) providing a handle wafer having a second layer of doped silica glass on an exposed surface thereof;
 (f) engaging together said handle wafer and said support structure, wherein said engagement is between said first and second layers of doped silica glass; and
 (g) bonding said surfaces of said first and second layers of doped silica glass using a rapid thermal annealer.

16. The method of claim 15, further comprising the step of removing said support structure from said layer of silicon.

17. The method of claim 16 wherein said bonding includes the steps of bringing an exposed surface of said second layer of doped silica glass and an exposed surface of said first layer of doped silica glass into contact, and heating said layers of doped silica glass to a temperature between approximately 800° C. and approximately 1200° C. for approximately three to ten minutes.

18. The method of claim 17, wherein said semiconductor material includes silicon, said support structure includes a silicon substrate, and said insulative material includes an oxide of silicon.

19. The method of claim 17, wherein said semiconductor material includes silicon, said support structure includes a silicon substrate, and said insulative material includes silicon nitride, said method further comprising the step of providing a pad oxide between said semiconductor material and said silicon nitride.

20. The method of claim 17, further comprising the step of providing a second layer of insulative material between said handle wafer and said second layer of doped silica glass.

21. The method of claim 17, wherein said doped silica glass contains approximately 4% phosphorous and 4% boron, and said layers of doped silica glass are each between about 500 to 10,000 angstroms thick.

* * * * *